(12) United States Patent
Sato et al.

(10) Patent No.: US 8,093,158 B2
(45) Date of Patent: Jan. 10, 2012

(54) SEMICONDUCTOR DEVICE MANUFACTURING METHOD AND SUBSTRATE PROCESSING APPARATUS

(75) Inventors: Taketoshi Sato, Toyama (JP); Masayuki Tsuneda, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 113 days.

(21) Appl. No.: 12/750,105

(22) Filed: Mar. 30, 2010

(65) Prior Publication Data

US 2011/0065283 A1  Mar. 17, 2011

(30) Foreign Application Priority Data

Sep. 11, 2009 (JP) .................................. 2009-210590

(51) Int. Cl.
*H01L 21/30* (2006.01)

(52) U.S. Cl. ............ 438/758; 257/E21.17; 257/E21.269; 257/E21.274; 257/E21.478; 257/E21.586; 438/478; 438/759

(58) Field of Classification Search ............. 257/E21.17, 257/E21.269, E21.274, E21.478, E21.586; 438/478, 758, 759
See application file for complete search history.

(56) References Cited

FOREIGN PATENT DOCUMENTS

| | | |
|---|---|---|
| JP | 2006-237532 | 9/2006 |
| JP | 3947126 | 7/2007 |
| KR | 1020020074708 | 10/2002 |
| KR | 1020040043921 | 5/2004 |
| KR | 1020070106286 | 11/2007 |
| KR | 1020080106294 | 12/2008 |

*Primary Examiner* — Asok Sarkar

(74) *Attorney, Agent, or Firm* — Brundidge & Stanger, P.C.

(57) ABSTRACT

Provided are a semiconductor device manufacturing method and a substrate processing apparatus. The method comprise: a first process of forming a film containing a predetermined element on a substrate by supplying a source gas containing the predetermined element to a substrate processing chamber in which the substrate is accommodated; a second process of removing the source gas remaining in the substrate processing chamber by supplying an inert gas to the substrate processing chamber; a third process of modifying the predetermined element-containing film formed in the first process by supplying a modification gas that reacts with the predetermined element to the substrate processing chamber; a fourth process of removing the modification gas remaining in the substrate processing chamber by supplying an inert gas to the substrate processing chamber; and a filling process of filling an inert gas in a gas tank connected to the substrate processing chamber.

7 Claims, 7 Drawing Sheets

SEMICONDUCTOR DEVICE MANUFACTURING METHOD AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2009-210590, filed on Sep. 11, 2009, in the Japanese Patent Office, the entire contents of which are hereby incorporated by reference.

BACKGROUND OF THE INVENTION

1. Field of the Invention

The present invention relates to a method of manufacturing a semiconductor device such as a semiconductor integrated circuit (hereinafter referred to as an IC), and more particularly, to a substrate processing apparatus for forming a desired film on a substrate such as a semiconductor wafer (hereinafter referred to as a wafer) on which devices such as an IC will be formed, and a method of manufacturing a semiconductor device such as an IC.

2. Description of the Prior Art

In a method of manufacturing an IC, a batch type vertical apparatus may be used to form a film. For example, referring to Patent Document 1, in a semiconductor device manufacturing process, when a film is formed using an amine-based material, for example, by an atomic layer deposition (ALD) method, a titanium (Ti) source and a nitrogen (N) source are alternately supplied to a semiconductor silicon substrate disposed in a processing chamber so as to form a TiN film. For a change from Ti source to N source, purging is performed using hydrogen ($H_2$) so as to remove the Ti source from the processing chamber, and for a change from N source to Ti source, purging is performed using $H_2$ so as to remove the N source from the processing chamber.

[Patent Document 1]
Japanese Unexamined Patent Application Publication No. 2006-269532

For example, in the case of a substrate processing apparatus configured to form a film by alternately supplying sources (A) and (B) to a substrate disposed in a processing chamber so that the molecules of the sources can be adsorbed on the substrate, when one of the sources is supplied but the other is not yet supplied, it is necessary to remove the former source from the processing chamber and the surface of the substrate. in a conventional method, to remove a source from the inside of the processing chamber or the like, hydrogen ($H_2$) gas or inert gas such as nitrogen ($N_2$) gas is continuously or intermittently supplied to the inside of the processing chamber while exhausting the inside of the processing chamber. In such a method, however, it takes long time to remove surplus source molecules adsorbed on a part such as the surface of a substrate, and as a result, productivity decreases. Moreover, in a conventional purge method, if purge time is reduced, purging is insufficiently performed, and as a result, film thickness is increased.

SUMMARY OF THE INVENTION

An object of the present invention is to provide a semiconductor device manufacturing method and a substrate processing apparatus, according to which molecules of a surplus source can be removed from a substrate processing chamber within a short time.

According to the present invention, when a source is removed from a substrate processing chamber, a purge (removal) inert gas is first stored in a gas tank and is then momentarily supplied to the substrate processing chamber. In this case, the kinetic energy of the purge inert gas is high when the purge inert gas collides with molecules of a source gas attached to a wafer or the inner wall of the substrate processing chamber. By this collision, molecules of the source gas that are physically adsorbed on parts such as the wafer but not chemically coupled to the parts can be separated.

In addition, since the purge inert gas is momentarily supplied to the inside of the substrate processing chamber, the inside pressure of the substrate processing chamber is high as compared with the case of a conventional purge method in which exhausting is performed while supply an inert gas, and thus molecules of the purge inert gas can reach even the insides of grooves or holes formed in the surface of the wafer to increase purge effect at the grooves or holes. Since physical adsorption force is dependent on the van der Waals force of source molecules acting on the surface of a film, the inside pressure of the substrate processing chamber is properly increased according to the kinds of sources and films.

According to an aspect of the present invention, there is provided a semiconductor device manufacturing method comprising:

a first process of forming a film containing a predetermined element on a substrate by supplying a source gas containing the predetermined element to a substrate processing chamber in which the substrate is accommodated;

a second process of removing the source gas remaining in the substrate processing chamber by supplying an inert gas to the substrate processing chamber;

a third process of modifying the predetermined element-containing film formed in the first process by supplying a modification gas that reacts with the predetermined element to the substrate processing chamber;

a fourth process of removing the modification gas remaining in the substrate processing chamber by supplying an inert gas to the substrate processing chamber; and a filling process of filling an inert gas in a gas tank connected to the substrate processing chamber, wherein the filling process is performed before each of the second process and the fourth process, and in each of the second process and the fourth process, the inert gas filled in the gas tank in the filling process is supplied to the substrate processing chamber.

DETAILED DESCRIPTION OF THE PREFERRED EMBODIMENTS

Figure 1:
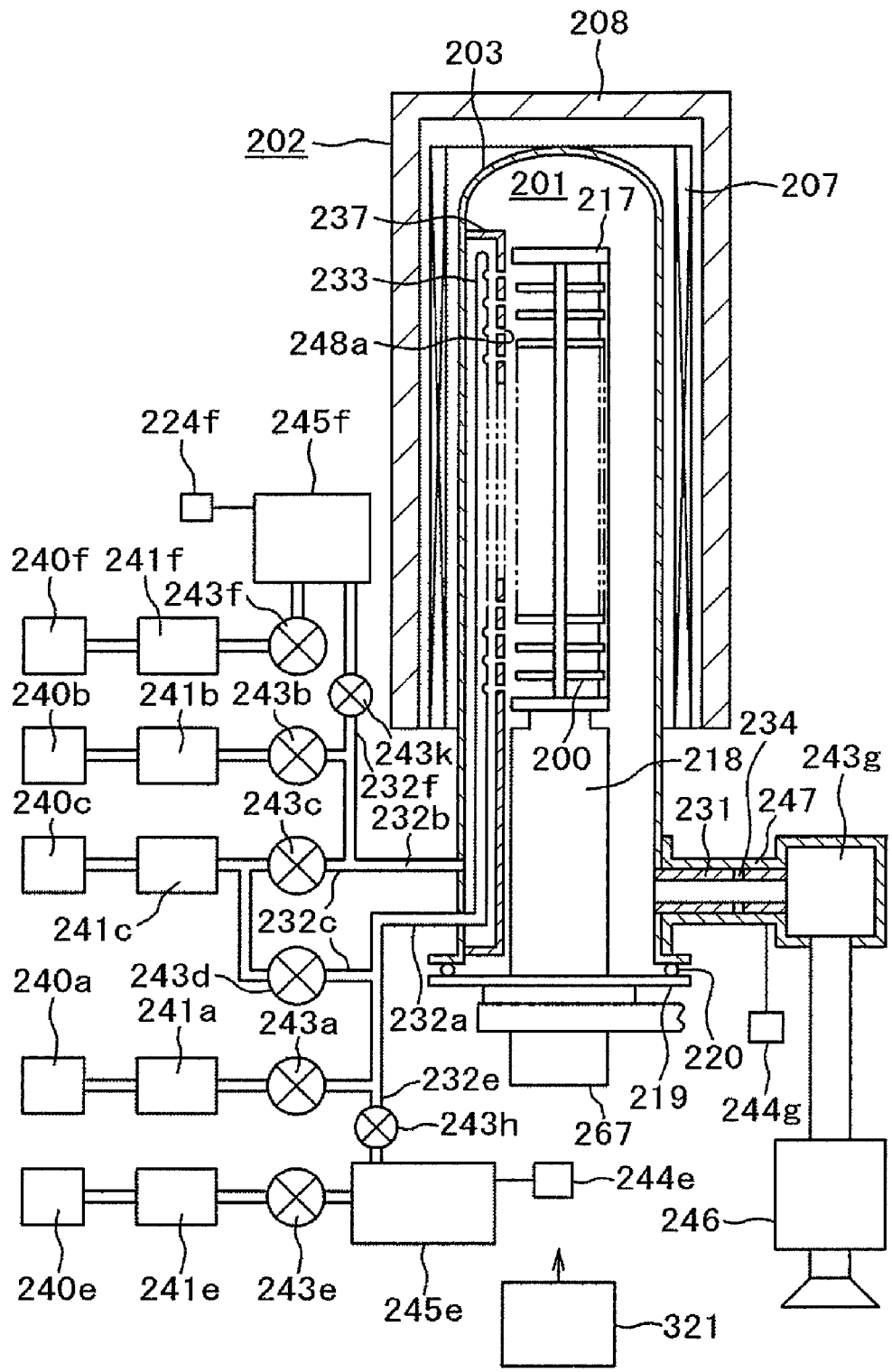
FIG. 1 is a vertical sectional view illustrating a process furnace of a batch type vertical film-forming apparatus relevant to an embodiment of the present invention.
Figure 2:
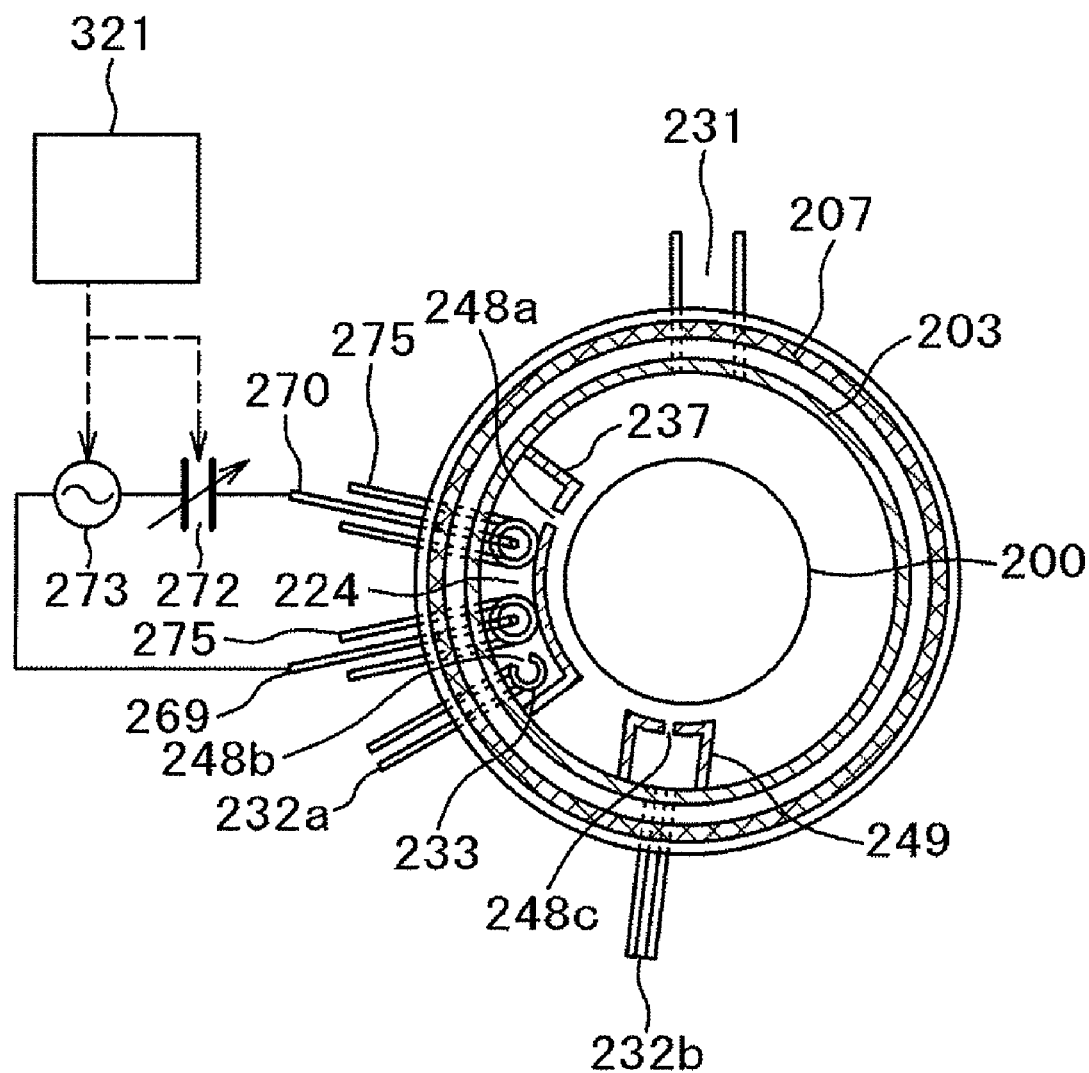
FIG. 2 is a horizontally sectional view illustrating the process furnace of the batch type vertical film-forming apparatus relevant to an embodiment of the present invention.
Figure 6:
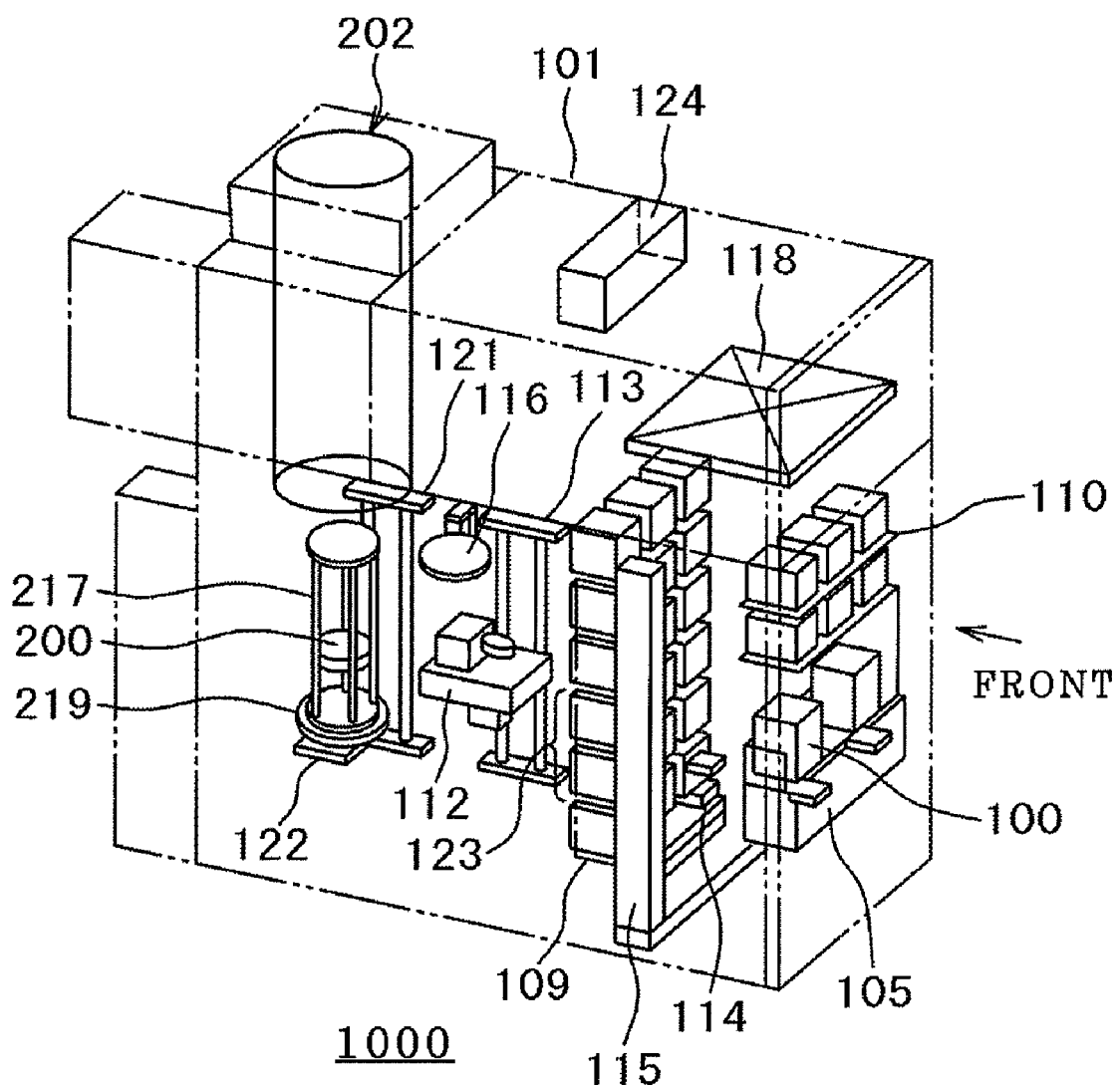
FIG. 6 is a perspective view illustrating the batch type vertical film-forming apparatus relevant to an embodiment of the present invention.

Embodiments of the present invention will be described hereinafter with reference to the attached drawings. FIG. 1 is a vertical sectional view illustrating a process furnace of a batch type vertical film-forming apparatus relevant to an embodiment of the present invention. FIG. 2 is a horizontally sectional view illustrating the process furnace of the batch type vertical film-forming apparatus relevant to an embodiment of the present invention. FIG. 6 is a perspective view illustrating the batch type vertical film-forming apparatus relevant to an embodiment of the present invention.

In the current embodiment, a substrate processing apparatus relevant to the present invention is configured to alternately supply two or more kinds of film-forming source gases to a substrate so as to allow the source gases to be adsorbed on the substrate in units of one to several atomic layers for forming a film by a surface reaction

[Process Furnace]

As shown in FIG. 1, FIG. 2, and FIG. 6, a substrate processing apparatus 1000 relevant to the current embodiment includes a process furnace 202, and the process furnace 202 includes a reaction tube 203 made of quartz. The reaction tube 203 is a reaction vessel configured to accommodate substrates (in this example, wafers 200) and treat the wafers 200 by heat. The reaction tube 203 is installed inside a heating unit (in this example, a resistance heater 207). The bottom side of the reaction tube 203 is hermetically sealed by a seal cap 219 with a sealing member (in this example, an O-ring 220) being disposed therebetween.

At the outside of the reaction tube 203 and the heater 207, an insulating member 208 is installed. The insulating member 208 is installed in a manner such that the insulating member 208 covers the topsides of the reaction tube 203 and the heater 207.

The heater 207, the insulating member 208, and the reaction tube 203 constitute the process furnace 202. In addition, a substrate processing chamber 201 is formed by the reaction tube 203, the seal cap 219, and a buffer chamber formed in the reaction tube 203.

On the seal cap 219, a substrate holding member (boat 217) is erected with a quartz cap 218 being disposed therebetween. The quartz cap 218 is a part that holds the boat 217. The boat 217 is configured to be inserted into the process furnace 202 through an opened bottom side of the process furnace 202. In the boat 217, a plurality of wafers 200 that will be batch-processed are horizontally oriented and arranged in multiple stages in a tube-axis direction (vertical direction). The heater 207 is configured to heat wafers 200 inserted in the process furnace 202 to a predetermined temperature.

[Source Gas Supply Unit]

At the process furnace 202, a plurality of (at least two) gas supply pipes 232a and 232b are installed. Through the two gas supply pipes 232a and 232b, at least two kinds of process gases (source gases) that react with each other are independently supplied to the process furnace 202 in turns.

Via the (first) gas supply pipe 232b, a first process gas is supplied from a first gas supply source 240b to the substrate processing chamber 201 through a flow rate control device such as a mass flow controller (MFC) 241b, an on-off value 243b, and a gas supply chamber 249 (refer to FIG. 2).

Via the (second) gas supply pipe 232a, a second process gas is supplied from a second gas supply source 240a to the substrate processing chamber 201 through an MFC 241a, an on-off value 243a, and the buffer chamber 237 formed in the reaction tube 203.

A first source gas supply unit is constituted by parts such as the first gas supply source 240b, the MFC 241b, and the gas supply pipe 232b. In addition, a second source gas supply unit is constituted by parts such as the second gas supply source 240a, the MFC 241a, and the gas supply pipe 232a.

[Inert Gas Supply Unit]

As shown in FIG. 1, a gas supply pipe 232f is connected to the upstream side of the first gas supply pipe 232b. At the gas supply pipe 232f, a first inert gas supply source 240f, an MFC 241f, an on-off valve 243f, a gas tank 245f, and an on-off valve 243k are sequentially installed from the upstream side of the gas supply pipe 232f. At the gas tank 245f, a pressure sensor 244f is installed. In the current example, the inner diameter of the gas tank 245f is greater than any one of a gas pipe inner diameter between the first inert gas supply source 240f and the on-off valve 243f, a gas pipe inner diameter between the gas tank 245f and the on-off valve 243f, a gas pipe inner diameter between the gas tank 245f and the on-off valve 243k, the inner diameter of the gas supply pipe 232f, and the inner diameter of the first gas supply pipe 232b.

A gas supply pipe 232e is connected to the upstream side of the second gas supply pipe 232a. At the gas supply pipe 232e, a second inert gas supply source 240e, an MFC 241e, an on-off valve 243e, a gas tank 245e, and an on-off valve 243h are sequentially installed from the upstream side of the gas supply pipe 232e. At the gas tank 245e, a pressure sensor 244e is installed. In the current example, the inner diameter of the gas tank 245e is greater than any one of a gas pipe inner diameter between the second inert gas supply source 240e and the on-off valve 243e, a gas pipe inner diameter between the gas tank 245e and the on-off valve 243e, a gas pipe inner diameter between the gas tank 245e and an on-off valve 243h, the inner diameter of the gas supply pipe 232e, and the inner diameter of the second gas supply pipe 232a.

In the current embodiment, the ratio of the volume of the substrate processing chamber 201/the volume of the gas tank 245f, or the ratio of the volume of the substrate processing chamber 201/the volume of the gas tank 245e is about 200 to about 2000.

An inert gas supply unit is constituted by parts such as the first inert gas supply source 240f, the MFC 241f, and the gas supply pipe 232b, or parts such as the second inert gas supply source 240e, the MFC 241e, and the gas supply pipe 232a.

Figure 4:
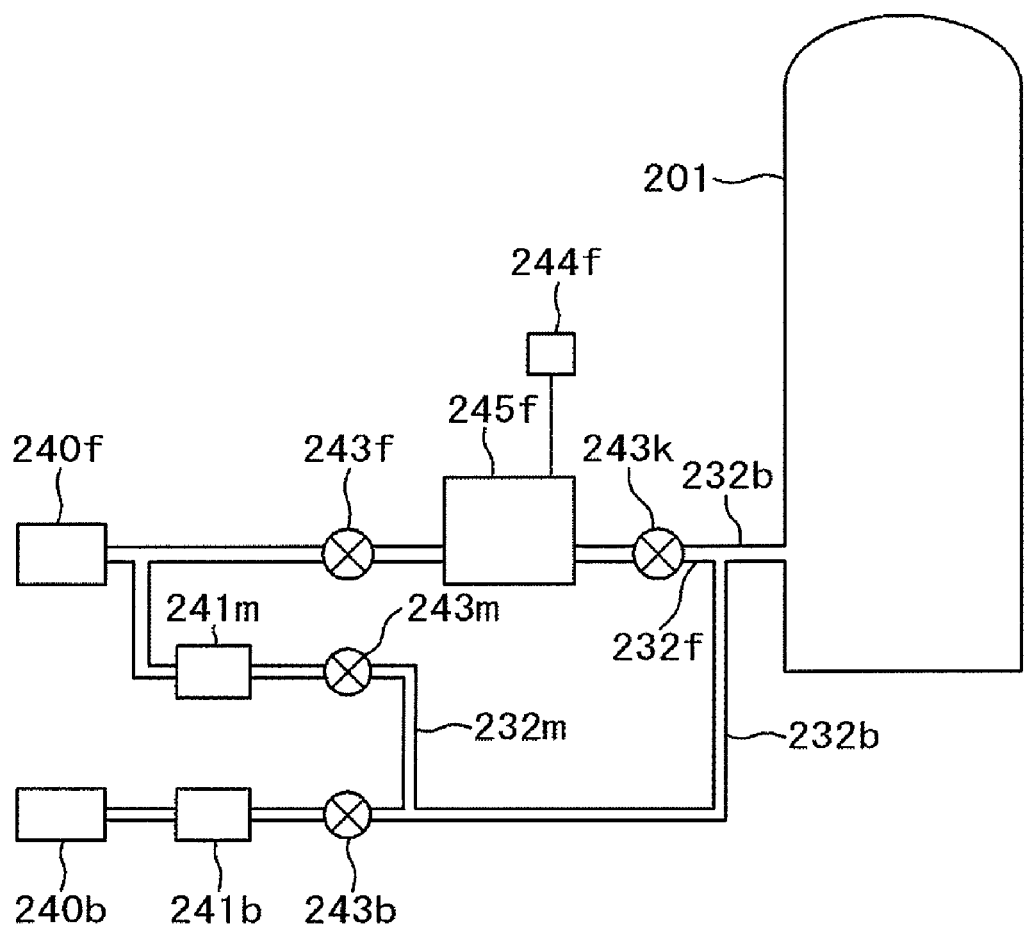
FIG. 4 is a view illustrating an example of inert gas supply lines relevant to an embodiment of the present invention.
Figure 5:
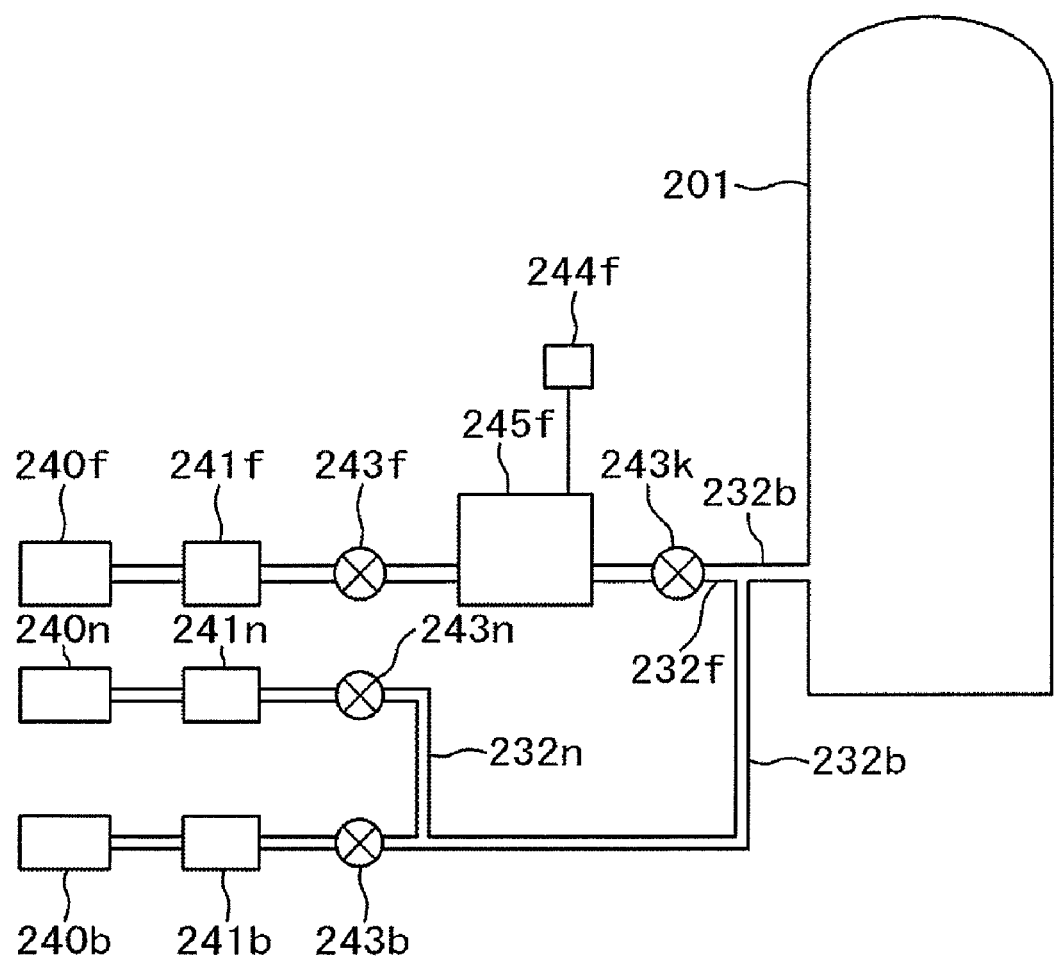
FIG. 5 is a view illustrating another example of inert gas supply lines relevant to an embodiment of the present invention.

In FIG. 1, the gas supply pipe 232f (inert gas supply pipe) is connected to the first gas supply pipe 232b, and the gas supply pipe 232e (inert gas supply pipe) is connected to the second gas supply pipe 232a. However, alternatively, a plurality of inert gas supply pipes may be connected to each of the first gas supply pipe 232b and the second gas supply pipe 232a. For example, as shown in FIG. 4, a plurality of inert gas supply pipes 232f and 232m may be connected to the first gas supply pipe 232b. Alternatively, as shown in FIG. 5, a plurality of inert gas supply pipes 232f and 232n may be connected to the first gas supply pipe 232b. Inert gas supply pipes may be connected to the second gas supply pipe 232a in the same manner as in the case of the first gas supply pipe 232b. FIG. 4 is a view illustrating an example of inert gas supply lines relevant to an embodiment of the present invention. FIG. 5 is a view illustrating another example of inert gas supply lines relevant to an embodiment of the present invention.

In FIG. 4, two inert gas supply pipes branch off from the first inert gas supply source 240f, in which one of the two inert gas supply pipes is connected to the gas tank 245f through the on-off valve 243f, and the other is connected to an MFC 241m. In this case, while collecting an inert gas in the gas tank 245f by opening the on-off valve 243f and closing the on-off valve 243k, an inert gas of which the flow rate is controlled by the MFC 241m can be supplied to the substrate processing chamber 201 through the first gas supply pipe 232b by opening an on-off valve 243m.

In FIG. 5, an inert gas supply source 240n is installed independent of the first inert gas supply source 240f, and the inert gas supply source 240n is connected to the first gas supply pipe 232b through an MFC 241n and an on-off valve 243n. Like the example shown in FIG. 4, in the example shown in FIG. 5, while collecting an inert gas in the gas tank 245f by opening the on-off valve 243f and closing the on-off valve 243k, an inert gas of which the flow rate is controlled by the MFC 241n can be supplied to the substrate processing chamber 201 through the first gas supply pipe 232b by opening the on-off valve 243n.

As schematically shown in FIG. 4 and FIG. 5, it is preferable that the inner diameter of the inert gas supply pipe 232f be greater than the inner diameter of a part of the first gas supply pipe 232b which is located at the upstream side of the joint between the inert gas supply pipe 232f and the first gas supply pipe 232b. In this case, inert gas collected in the gas tank 245f can be easily supplied to the substrate processing chamber 201 in a short time. This is the same in the case of the second gas supply pipe 232a.

As described above, in the current embodiment, the inner diameters of the gas tanks 245f and 245e are greater than the inner diameters of gas supply pipes. However, if the inner diameters of gas supply pipes are sufficiently large, the inner diameters of the gas tanks 245f and 245e may not be greater than the inner diameters of gas supply pipes. Furthermore, instead of connecting a gas tank to the first gas supply pipe 232b or the second gas supply pipe 232a, the inert gas supply pipes 232e and 232f may be directly connected to the substrate processing chamber 201.

In addition, a plurality of gas tanks may be installed, and inert gas may be supplied to the substrate processing chamber 201 from the respective gas tanks. Alternatively, only a single gas tank may be installed, and inert gas may be supplied to the substrate processing chamber 201 from the gas tank. For example, only one of the gas tanks 245e and 245f may be installed.

[Cleaning Gas Supply Unit]

A cleaning gas supply pipes 232c is connected to the first and second inert gas supply pipes 232b and 232a at the downstream sides of on-off valves 243c and 243d, respectively. At the cleaning gas supply pipe 232c, a third gas (cleaning gas) supply source 240c, an MFC 241c, and the on-off valve 243c or the on-off valve 243d are sequentially installed from the upstream side of the cleaning gas supply pipe 232c.

From the cleaning gas supply pipe 232c connected to the second gas supply pipe 232a and the first gas supply pipe 232b, inert gas is supplied to the substrate processing chamber 201 through the MFC 241c, the on-off valve 243d, and the buffer chamber 237, or through the MFC 241c, the on-off valve 243c, and the gas supply chamber 249.

To prevent attachment of reaction byproducts, pipe heaters (not shown) capable of heating pipes to about 120° C. are mounted on the gas supply pipes 232a, 232b, and 232c.

[Exhaust Unit]

An end of a gas exhaust pipe 231 is connected to the gas exhaust pipe 231 to exhaust the inside of the substrate processing chamber 201. The other end of the gas exhaust pipe 231 is connected to a vacuum pump (exhaust device) 246 through an auto pressure controller (APC) valve 243g. The gas exhaust pipe 231 is formed by connecting a plurality of exhaust pipes in series and disposing O-rings between the exhaust pipes. The inside of the substrate processing chamber 201 is exhausted using the vacuum pump 246.

The APC valve 243g is an on-off valve that can be opened and closed for starring and stopping exhausting, and is a pressure regulating valve of which the opening degree can be adjusted for pressure control.

To prevent attachment of reaction byproducts, a heater (exhaust pipe heating unit) 247 capable of heating a part to at least about 150° C. is mounted on the gas exhaust pipe 231. The heater 247 is controlled by a controller 321.

An exhaust unit is constituted by parts such as the gas exhaust pipe 231, the APC valve 243g, and the vacuum pump 246.

[First Source Gas Supply Unit]

As shown in FIG. 2, at the inner wall of the reaction tube 203, the gas supply chamber 249 is installed to supply a first process gas. The gas supply chamber 249 is installed from the lower to upper part of the reaction tube 203 along the inner wall of the reaction tube 203 in a vertical direction (stacked direction of wafers 200) so as to form a gas distribution space. The gas supply chamber 249 is independent of the buffer chamber 237 (described later) configured to supply a second process gas. When a plurality kinds of gases are alternately supplied to wafers 200 in a film forming process performed by an ALD method, the operation of supplying the plurality kinds of gases is shared by the gas supply unit 249 and the buffer chamber 237.

The gas supply chamber 249 includes a plurality of gas supply holes 248c. Like in the case of gas supply holes 248a of the buffer chamber 237 (described later), the gas supply holes 248c are formed in the vicinity of wafers 200 with the same pitch in a vertical direction for supplying a first process gas. The first gas supply pipe 232b is connected to the lower side of the gas supply chamber 249.

Like in the case of the gas supply holes 248a of the buffer chamber 237 (described later), if the pressure different between the buffer chamber 237 and the substrate processing chamber 201 is small, it is preferable that the gas supply holes 248c have the same size and pitch from the upstream side to the downstream side. However, if the pressure different is large, it is preferable that the size of the gas supply holes 248c increase from the upstream side to the downstream side, or the pitch of the gas supply holes 248b decrease from the upstream side to the downstream side.

[Second Source Gas Supply Unit]

As shown in FIG. 2, at the inner wall of the reaction tube 203, the buffer chamber 237 is installed to supply a second process gas. The buffer chamber 237 is installed from the lower to upper part of the reaction tube 203 along the inner wall of the reaction tube 203 in a vertical direction (stacked direction of wafers 200) so as to form a gas distribution space.

As shown in FIG. 2, in the inner wall of the buffer chamber 237, that is, in the vicinity of a circumferential end part of the inner wall of the buffer chamber 237 adjacent to the wafers 200, the gas supply holes 248a are formed to supply gas to the substrate processing chamber 201. The gas supply holes 248a are formed at positions 120 degrees apart from the gas supply holes 248c in the clockwise direction along the inner circumference of the reaction tube 203. The gas supply holes 248a are formed toward the center (center axis) of the reaction tube 203. Along a predetermined length (a) from the lower side to the upper side in the vertical direction (stacked direction of wafers 200), the gas supply holes 248a are arranged with the same size and same pitch.

Near the other circumference end part of the buffer chamber 237 opposite to the gas supply holes 248a, a nozzle 233 is installed from the lower side to the upper side of the reaction tube 203 in the vertical direction (stacked direction of wafers 200). A plurality of gas supply holes 248b are formed in the nozzle 233 for supply gas.

Along the same predetermined length (a) as the length (a) along which the gas supply holes 248a are arranged, the gas supply holes 248b are arranged in the vertical direction (stacked direction of wafers 200). The gas supply holes 248b correspond to the gas supply holes 248a in a one-to-one relation.

If the pressure different between the buffer chamber 237 and the substrate processing chamber 201 is small, it is preferable that the gas supply holes 248b have the same size and pitch from the upstream side to the downstream side.

However, if the pressure different is large, it is preferable that the size of the gas supply holes 248b increase from the upstream side to the downstream side, or the pitch of the gas supply holes 248b decrease from the upstream side to the downstream side.

By adjusting the size and pitch of the gas supply holes 248b from the upstream side to the downstream side, gas can be injected with substantially the same flow rate at each of gas supply holes 248b. Since gas injected through the gas supply holes 248b is first introduced into the buffer chamber 237, gas flow velocity can be uniformly maintained.

That is, in the buffer chamber 237, gas injected through the gas supply holes 248b decreases in particle velocity, and then, the gas is injected to the substrate processing chamber 201 through the gas supply holes 248a. Owing to this, when the gas injected through the gas supply holes 248b is re-injected through the gas supply holes 248a, the flow rate and velocity of the gas can be uniform.

As shown in FIG. 2, long and thin rod-shaped electrodes 269 and 270 are installed in the buffer chamber 237 in a state where electrode protecting tubes 275 protect the rod-shaped electrodes 269 and 270 from the upper sides to the lower sides of the rod-shaped electrodes 269 and 270. One of the rod-shaped electrodes 269 and 270 is connected to a high-frequency power source 273 through a matching device 272, and the other of the rod-shaped electrodes 269 and 270 is connected to a reference potential (earth potential). By turning on the high-frequency power source 273, gas supplied to a plasma generation region 224 between the rod-shaped electrodes 269 and 270 can be excited into a plasma state.

The electrode protecting tubes 275 can be inserted into the buffer chamber 237 in a state where the electrode protecting tubes 275 isolate the rod-shaped electrodes 269 and 270 from the inside atmosphere of the buffer chamber 237. If the insides of the electrode protecting tubes 275 are in the same state as the outside air (atmospheric state), the rod-shaped electrodes 269 and 270 inserted in the electrode protecting tubes 275 may be oxidized when heated by the heater 207. Therefore, an inert gas filling mechanism is installed to fill inert gas such as nitrogen gas in the electrode protecting tubes 275 or fill inert gas in the electrode protecting tubes 275 while discharging the inert gas from the electrode protecting tubes 275, so as to reduce oxygen concentration sufficiently for prevent oxidation of the rod-shaped electrodes 269 and 270.

[Boat]

As shown in FIG. 1, the boat 217 is placed in the center part of the reaction tube 203. In the boat 217, a plurality of wafers 200 are vertically arranged in multiple stages at the same intervals. The boat 217 is configured to be loaded into and unloaded from the reaction tube 203 by a boat elevator 121 illustrated in FIG. 6. FIG. 6 will be explained later.

A boat rotating mechanism 267 is installed to rotate the boat 217 for improving process uniformity. By the boat rotating mechanism 267, the boat 217 held on the quartz cap 218 is rotated.

[Control Unit]

The controller 321 (control unit) is electrically connected to parts such as the MFCs 241a, 241b, 241c, 241e, and 241f; the on-off valves 243a, 243b, 243c, 243d, 243e, 243f, 243h, and 243k, the APC valve 243g, the pressure sensors 244e, 244f, and 244g, the heater 207, the vacuum pump 246, the boat rotating mechanism 267, the boat elevator 121, the high-frequency power source 273, and the matching device 272.

The controller 321 controls operations of parts of the substrate processing apparatus 1000, such as flow rate control operations of the MFCs 241a, 241b, 241c, 241e, and 241f; opening/closing operations of the on-off valves 243a, 243b, 243c, 243d, 243e, 243f, 243h, and 243k; opening/closing and pressure adjusting operations of the APC valve 243g; a temperature adjusting operation of the heater 207; turning-on and -off of the vacuum pump 246; the rotation speed of the boat rotating mechanism 267; lifting operations of the boat elevator 121; power supply of the high-frequency power source 273; and an impedance adjustment operation of the matching device 272.

[Example of Film-Forming Process]

Next, an explanation will be given on an exemplary process of forming a TiN film by an ALD method using titanium chloride ($TiCl_4$) and ammonia ($NH_3$) as process gases. In an ALD method, at least two process gases that react with each other are alternately supplied to form a desired film on the surface of a substrate disposed in a processing chamber.

First, under the control of the controller 321, wafers 200 on which films will be formed are charged into the boat 217, and the boat 217 is loaded into the process furnace 202. After the boat 217 is loaded, under the control of the controller 321, the following step A to step F are performed.

[Step A: First Process Gas Supply Step]

In step A, the on-off valve 243b installed at the first gas supply pipe 232b, and the APC valve 243g installed at the gas exhaust pipe 231 are both opened, so that $TICL_4$ gas (first process gas) of which the flow rate is controlled by the MFC 241b can be supplied into the substrate processing chamber 201 through the gas supply holes 248c of the gas supply chamber 249 while the $TiCl_4$ gas is exhausted from the substrate processing chamber 201 through the gas exhaust pipe 231.

When $TiCl_4$ is allowed to flow, the APC valve 243g is properly adjusted based on pressure values detected by the pressure sensor 244g, and the inside pressure of the substrate processing chamber 201 is kept at 20 Pa to 200 Pa. The MFC 241b controls the supply flow rate of the $TiCl_4$ in the range from 0.2 g/min to 0.8 g/min. The wafers 200 are exposed to the $TiCl_4$ for 2 seconds to 20 seconds. At this time, the temperature of the heater 207 is set to a level suitable for keeping the temperature of the wafers 200 in the range from 200° C. to 600° C. By allowing a flow of $TiCl_4$, $TiCl_4$ can be chemically coupled to the surfaces of the wafers 200. In addition, there also exists $TiCl_4$ physically adsorbed on the surfaces of the wafers 200 although not chemically coupled to the surfaces of the wafers 200.

In addition, while $TiCl_4$ is allowed to flow, the heater 247 (exhaust pipe heating unit) heats the gas exhaust pipe 231 and the O-ring 234. For example, the heater 247 is controlled to keep the gas exhaust pipe 231 at about 120° C. At a low temperature, organic metal materials (in this example, $TiCl_4$) easily adhere to the O-ring 234. If an organic metal material adheres to the O-ring 234, the organic metal material may enter the substrate processing chamber 201 during the following steps B to F, and thus, film quality may deteriorate or impurities may generated.

Therefore, while the wafers 200 are processed using an organic metal material, the heater 247 is operated to prevent adhering of the organic metal material to the O-ring 234. For example, since $TiCl_4$ easily adheres at a temperature lower than 150° C., the heater 247 is controlled to heat the gas exhaust pipe 231 to a temperature of 150° or higher.

In addition, when $TiCl_4$ is allowed to flow, if necessary, inert gas such as $N_2$ gas may be simultaneously allowed to flow. Specifically, for example, in the structure of FIG. 1, the on-off valve 243f and the on-off valve 243k may be opened, and while performing a flow rate controlling operation by the MFC 241f, inert gas may be supplied from the first inert gas supply source 240f to the first gas supply pipe 232b through the gas tank 245f. Alternatively, as shown in FIG. 4, if two inert gas supply pipes branch off from the first inert gas supply source 240f, inert gas may be supplied to the first gas supply pipe 232b by using a route bypassing (detouring around) the gas tank 245f after controlling the flow rate of the inert gas using the MFC 241m. Alternatively, as shown in FIG. 5, if the inert gas supply source 240n is installed independent of the first inert gas supply source 240f, the on-off valve 243n may be opened to supply inert gas to the first gas supply pipe 232b while controlling the flow rate of the inert gas using the MFC 241n.

After the film forming by $TiCl_4$ is completed, the on-off value 243b is closed, and in a state where the APC valve 243g is opened, the substrate processing chamber 201 is vacuum-evacuated so as to exhaust remaining gas. At this time, the inside pressure of the substrate processing chamber 201 is kept at 10 Pa or lower.

[Step B: Purge Gas Storing Step]

In step B, the on-off valve 243k located at the downstream side of the gas tank 245f is closed, and the on-off valve 243f located at the upstream side of the gas tank 245f is opened, so as to supply inert gas (nitrogen gas) to the gas tank 245f from the first inert gas supply source 240f. The inside pressure of the gas tank 245f is detected by the pressure sensor 244f, and if the inside pressure of the gas tank 245f reaches a predetermined first pressure, the on-off valve 243f is closed to interrupt supply of inert gas to the gas tank 245f. The predetermined first pressure at which supply of inert gas is interrupted is determined by factors such as a relationship between the volumes of the gas tank 245f and the substrate processing chamber 201 or a relationship between the inner diameters of the gas supply pipes 232f and 232b. The predetermined first pressure is determined in a manner such that when inert gas stored in the gas tank 245f is supplied to the substrate processing chamber 201 in step C (described later), the inside pressure of the substrate processing chamber 201 is increased by about 10 Pa to about 200 Pa as compared with the inside pressure of the substrate processing chamber 201 before the inert gas is supplied. In the current embodiment, the predetermined first pressure is 0.1 atm to 2 atm.

In this way, the inside pressure of a gas tank can be detected using a pressure sensor so as to interrupt supply of inert gas to the gas tank if the detected inside pressure of the gas tank reaches a predetermined pressure. In this case, various substrate processing chambers having different volumes can be supported by using a gas tank having a fixed volume. In addition, by using the gas tank having a fixed volume, various film-forming processes can be handled although the film-forming processes require different optimal pressure increase values in the substrate processing chamber after inert gas is supplied to the substrate processing chamber.

Figure 3:
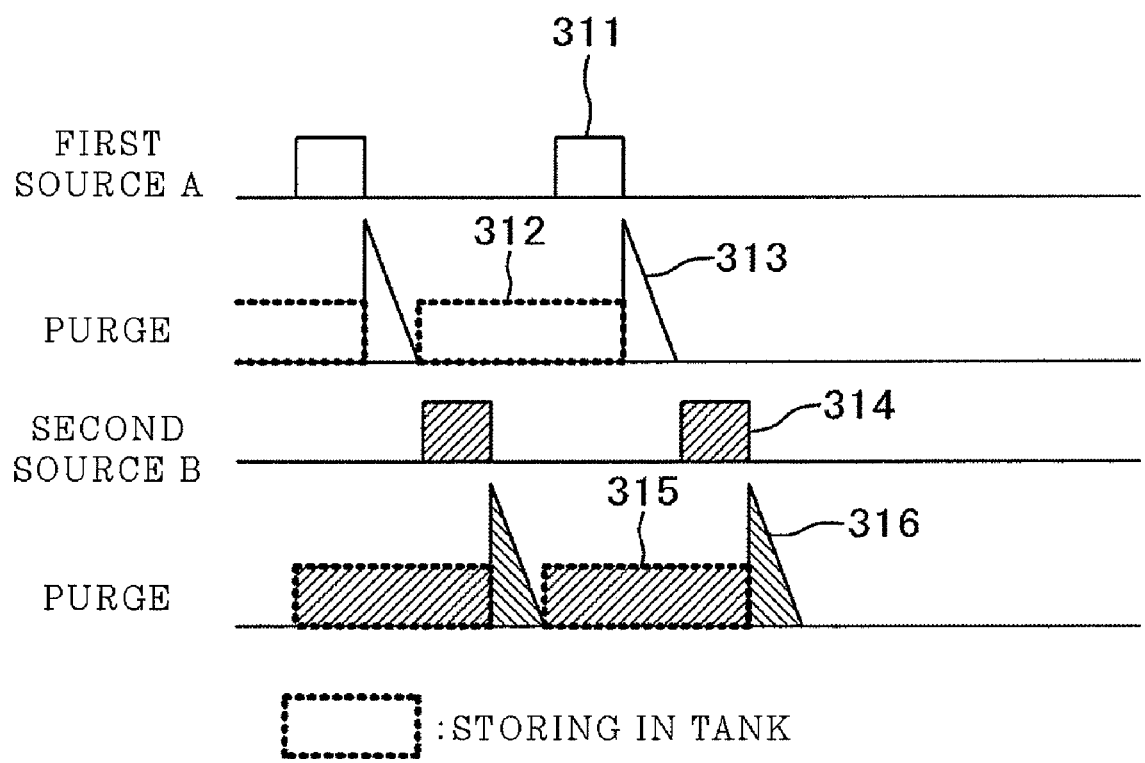
FIG. 3 is a view illustrating a film-forming sequence relevant to an embodiment of the present invention.

Furthermore, as shown in FIG. 3, it may be preferable that step B be performed together with a step such as step A but not together with step C (described later), so as to improve throughput. FIG. 3 is a view illustrating a film-forming sequence relevant to the current embodiment. In FIG. 3, the horizontal axis denotes time, and the vertical axis denotes flowrate schematically. In FIG. 3, reference numeral 311 denotes step A, reference numeral 312 denotes step B, reference numeral 313 denotes step C (described later), reference numeral 314 denotes step D (described later), reference numeral 315 denotes step E (described later), and reference numeral 316 denotes step F (described later). Referring to FIG. 3, step B is performed in parallel with a step such as step A or step D (described later). However, although throughput is decreased, step B may not be performed in parallel with such a step.

[Step C: First Process Gas Purge Step]

In step C, after the substrate processing chamber 201 is completely exhausted in step A, the on-off valve 243f is closed, and at the same time, the on-off valve 243k is opened in a state where the APC valve 243g of the gas exhaust pipe 231 is opened, so as to supply inert gas (in this example, nitrogen gas) to the substrate processing chamber 201 from the gas tank 245f through the gas supply pipes 232f and 232b for performing inert gas purging (in this example, nitrogen purging). By this nitrogen purging, source gas ($TiCl_4$) physically adsorbed on parts such as the surfaces of the wafers 200 but not chemically coupled to the parts is removed.

In the current embodiment, in a state where exhausting of the substrate processing chamber 201 is stopped, inert gas is supplied in a pulsed mode to the substrate processing chamber 201 from the gas tank 245f which is kept at about 0.1 atm to about 2 atm in step B. This nitrogen purge is performed for about 1 second to 5 seconds.

Thereafter, the on-off valve 243k of the gas supply pipe 232f is closed, and the substrate processing chamber 201 is exhausted to about 10 Pa or lower by using the vacuum pump 246, so that source gas or nitrogen released from the wafers 200 can be removed from the substrate processing chamber 201.

In this way, if inert gas is supplied from the gas tank 245f in a state where the APC valve 243g of the gas exhaust pipe 231 is opened, the flow velocity of the inert gas on the wafers 200 may not be decreased even at the downstream side opposite to the buffer chamber 237, and thus purging effect can be obtained.

[Step D: Second Process Gas Introduction Step]

In step D, after remaining gas is exhausted from the substrate processing chamber 201 in step C, a second process gas is supplied to the inside of the substrate processing chamber 201 from the second process gas supply unit. In detail, after remaining gas is exhausted from the substrate processing chamber 201 in step C, in a state where the APC valve 243g of the gas exhaust pipe 231 is opened, the on-off value 243a of the second gas supply pipe 232a is opened, so that ammonia ($NH_3$) gas (second process gas) supplied from the second gas supply source 240a and of which the flow rate is controlled by the MFC 241a can be ejected into the buffer chamber 237 through the gas supply holes 248b of the nozzle 233. Thereafter, surplus ammonia gas supplied to the substrate processing chamber 201 and ammonia gas remaining after reaction are exhausted through the gas exhaust pipe 231. At this time, high-frequency power may be applied between the rod-shaped electrodes 269 and 270 from the high-frequency power source 273 through the matching device 272 so as to excite the ammonia gas into plasma and then supply the plasma to the substrate processing chamber 201.

When ammonia gas is excited into plasma to flow the excited ammonia gas as an activated species, the APC valve 243g is properly adjusted to keep the inside pressure of the substrate processing chamber 201 in the range from 20 Pa to 65 Pa. In the current embodiment, the supply flow rate of ammonia is controlled in the range about 3 slm to about 10 slm by the MFC 241a. The wafers 200 are exposed to the activated species obtained by plasma-exciting ammonia for 10 seconds to 60 seconds. At this time, the temperature of the heater 207 is set to a level suitable for keeping the temperature of the wafers 200 in the range from 200° C. to 600° C.

By supplying the ammonia gas, $TiCl_4$ chemically coupled to silicon of the wafers 200 in step A is chemically coupled with ammonia to form Ti (titanium atom)-N (nitrogen atom) bonds. In the current embodiment, the ammonia gas supplied as a second process gas is a modification gas for modifying $TiCl_4$ chemically coupled to the wafers 200 in step A into Ti—N. Therefore, in the current embodiment, the second process gas supply unit is a modification gas supply unit. Herein, modification is to modify a film formed on a substrate and containing a first element into a film containing the first element and a second element by using a gas containing the second element.

Thereafter, the valve 243a of the second gas supply pipe 232a is closed to stop supply of ammonia. In a state where the APC valve 243g of the gas exhaust pipe 231 is opened, the substrate processing chamber 201 is exhausted to about 10 Pa or lower by using the vacuum pump 246, so as to exhaust remaining ammonia from the substrate processing chamber 201.

When ammonia gas is supplied, like in step A, inert gas may also be supplied from the inert gas supply source 240e.

[Step E: Purge Gas Storing Step]

In step E, the on-off valve 243h located at the downstream side of the gas tank 245e is closed, and the on-off valve 243e located at the upstream side of the gas tank 245e is opened, so as to supply inert gas (nitrogen gas) to the gas tank 245e from the inert gas supply source 240e. The inside pressure of the gas tank 245e is detected by the pressure sensor 244e, and if the inside pressure of the gas tank 245e reaches a predetermined second pressure, the on-off valve 243e is closed to interrupt supply of inert gas to the gas tank 245e. The predetermined second pressure at which supply of inert gas is interrupted is determined by factors such as a relationship between the volumes of the gas tank 245e and the substrate processing chamber 201 or a relationship between the inner diameters of the gas supply pipes 232a and 232e. The predetermined second pressure is determined in a manner such that when inert gas stored in the gas tank 245e is supplied to the substrate processing chamber 201 in step F (described later), the inside pressure of the substrate processing chamber 201 is increased by about 10 Pa to about 200 Pa as compared with the inside pressure of the substrate processing chamber 201 before the inert gas is supplied. In the current embodiment, the predetermined first pressure is 0.1 atm to 2 atm.

Furthermore, like in the case of step B, it may be preferable that step E be performed together with a step such as step D but not together with step F (described later) as shown in FIG. 3, so as to improve throughput.

[Step F: Second Process Gas Purge Step]

In step F, like in step C, after the substrate processing chamber 201 is completely exhausted in step D, the on-off valve 243e is closed, and at the same time, the on-off valve 243h is opened in a state where the APC valve 243g of the gas exhaust pipe 231 is opened, so as to supply inert gas (in this example, nitrogen gas) to the substrate processing chamber 201 from the gas tank 245e through the gas supply pipes 232e and 232a for performing nitrogen gas purging. By this nitrogen purging, source gas (ammonia gas) physically adsorbed on parts such as the surfaces of the wafers 200 but not chemically coupled to the parts is removed. The nitrogen purge is performed for about 1 second to 5 seconds.

Thereafter, the on-off valve 243h of the gas supply pipe 232e is closed, and the substrate processing chamber 201 is exhausted to about 10 Pa or lower by using the vacuum pump 246, so that source gas or nitrogen released from the wafers 200 can be removed from the substrate processing chamber 201.

In this way, if inert gas is supplied from the gas tank 245e in a state where the APC valve 243g of the gas exhaust pipe 231 is opened, the flow velocity of the inert gas on the wafers 200 may not be decreased even at the downstream side opposite to the buffer chamber 237, and thus purging effect can be obtained.

In step C or step F, since purge inert gas (in this example, nitrogen gas) is first stored in the gas tank 245f or the gas tank 245e and is then momentarily supplied to the substrate processing chamber 201 (in a very short time), the kinetic energy of the purge inert gas is high when the purge inert gas collides with molecules of the first process gas (source gas, in the example, $TiCl_4$) or molecules of the second process gas (source gas, in the example, ammonia gas) attached to the wafers 200 or the inner wall of the substrate processing chamber 201. By this collision, molecules of the source gas that are physically adsorbed on parts such as the wafers 200 but not chemically coupled to the parts are separated from the parts.

In addition, since the purge inert gas is momentarily supplied to the inside of the substrate processing chamber 201, the inside pressure of the substrate processing chamber 201 is high as compared with the case of a conventional purge method, and thus molecules of the purge inert gas can reach even the insides of grooves or holes formed in the surfaces of the wafers 200 to increase purge effect (source gas molecule removing effect) at the grooves or holes. According to the current embodiment, in step C or step F, when inert gas is supplied to the inside of the substrate processing chamber 201 from the gas tank 245f or the gas tank 245e, the inside pressure of the substrate processing chamber 201 is increased by about 10 Pa to 200 Pa within about 2 seconds as compared with the inside pressure of the substrate processing chamber 201 before the inert gas is supplied.

If the pressure increase is smaller than about 10 Pa, purge effect may be insufficient. On the other hand, in a state where the APC valve 243g is opened, if the pressure increase is larger than about 200 Pa, since exhaust system conductance is low, purge gas having kinetic energy may not collide with physically adsorbed molecules, and thus the purge effect may be insufficient.

In the purge of step C, it is necessary to sufficiently remove molecules of source gas which are physically adsorbed on parts such as the wafers 200 but not chemically coupled to the parts. Since physical adsorption force is dependent on the van der Waals force of source molecules acting on the surface of a film, whether the pressure increase in the substrate processing chamber 201 is sufficient is determined according to the kinds of sources and films. The degree of attack on source gas molecules by inert gas molecules can be estimated by a pressure increase peak in the substrate processing chamber 201.

By repeating the cycle of the above-described step A to step F a plurality of times, titanium nitride films can be formed on the wafers 200 to a predetermined thickness. In the purge of step C or step F, purge inert gas may be supplied to the inside of the substrate processing chamber 201 from the gas tank in a plurality of phases. However, to increase the inside pressure of the substrate processing chamber 201 in a short time, it is preferable that the supply of purge inert gas be performed at once.

In step A to step F, it is preferable that the heater 247 (exhaust pipe heating unit) continuously heat the gas exhaust pipe 231 to keep the gas exhaust pipe 231 at a predetermined temperature or higher. In step B to step F, if heating is suspended by stopping the operation of the heater 247, a predetermined time is necessary for re-heating to the predetermined temperature, and thus throughput may decrease. Therefore, in step A to step F, the heater 247 is controlled to continuously heat the gas exhaust pipe 231.

In addition, although $TiCl_4$ and $NH_3$ are used as process gases in the above-described example, the present invention is not limited thereto. For example, tetrakis(dimethylamino) titanium (TDMAT) and $NH_3$ may be used as process gases. In the case of using TDMAT and $NH_3$, the gas exhaust pipe 231 may be kept at 120° C. or higher in step A to step F.

In addition, although $NH_3$ is activated by exciting the $NH_3$ into plasma, the present invention is not limited thereto. For example, $NH_3$ may be activated by heating the $NH_3$ using the heater 207.

[Outline of Substrate Processing Apparatus]

Figure 7:
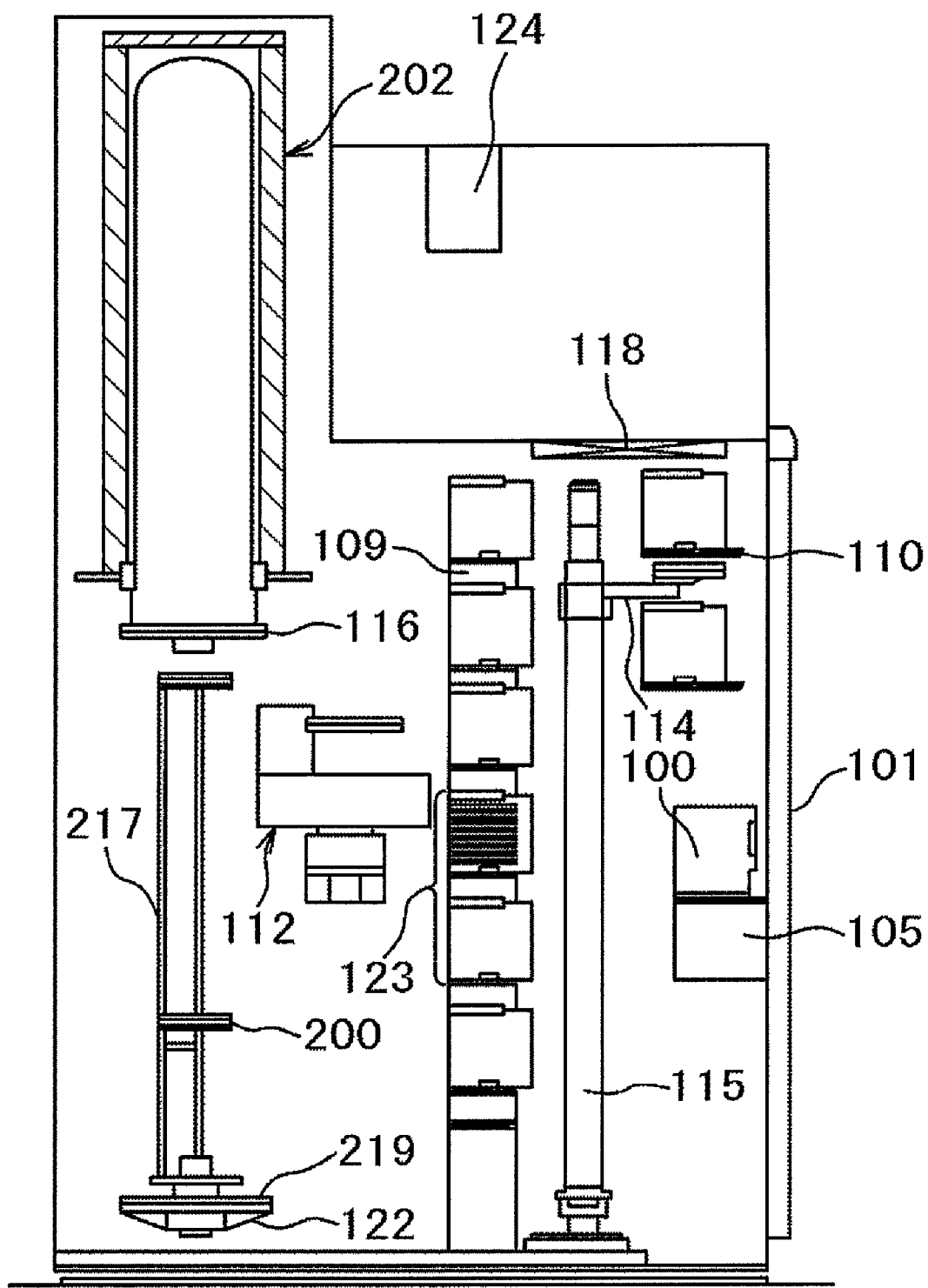
FIG. 7 is a vertical sectional view illustrating the batch type vertical film-forming apparatus relevant to an embodiment of the present invention.

Next, with reference to FIG. 6 and FIG. 7, the substrate processing apparatus 1000 relevant to the current embodiment will be schematically described. FIG. 6 is a perspective view illustrating the batch type vertical film-forming apparatus relevant to an embodiment of the present invention. FIG. 7 is a vertical sectional view illustrating the batch type vertical film-forming apparatus relevant to an embodiment of the present invention.

As shown in FIG. 6, at the front side of the inside of the case 101, a cassette stage 105 is installed. The cassette stage 105 is configured such that cassettes 100 used as substrate containers can be transferred between the cassette stage 105 and an external carrying device (not shown). At the rear side of the cassette stage 105, a cassette carrier 115 is installed. At the cassette carrier 115, a cassette shelf 109 is installed to store cassettes 100. In addition, at the upside of the cassette stage 105, an auxiliary cassette shelf 110 is installed to store cassettes 110. At the upside of the auxiliary cassette shelf 110, a cleaning unit 118 is installed to circuit clean air in the case 101.

At the rear upper side of the case 101, the process furnace 202 is installed. At the lower side of the process furnace 202, the boat elevator 121 is installed. The boat elevator 121 is used to raise and lower the boat 217 in which wafers 200 are charged toward and away from the process furnace 202. The boat 217 is a substrate holding tool configured to hold wafers 200 in a state where the wafers 200 are horizontally positioned and arranged in multiple stages. At the boat elevator 121, the seal cap 219 is installed as a cover for covering the bottom side of the process furnace 202. The seal cap 219 supports the boat 217 vertically.

Between the boat elevator 121 and the cassette shelf 109, a wafer transfer device 112 is installed to carry wafers 200. Beside the boat elevator 121, a furnace port shutter 116 is installed to hermetically close the bottom side of the process furnace 202. When the boat 217 is placed outside the process furnace 202, the bottom side of the process furnace 202 can be closed by the furnace port shutter 116.

A cassette 100 charged with wafers 200 is carried onto the cassette stage 105 from the external carrying device (not shown). Next, the cassette 100 is carried from the cassette stage 105 to the cassette shelf 109 or the auxiliary cassette shelf 110 by the cassette carrier 115. The cassette shelf 109 includes a transfer shelf 123, and the wafer transfer device 112 carries wafers 200 from a cassette 100 accommodated on the transfer shelf 123. A cassette 100 from which wafers 200 will be transferred to the boat 217 is transferred to the transfer shelf 123 by the cassette carrier 115. When a cassette 100 is transferred onto the transfer shelf 123, wafers 200 are transferred from the cassette 100 placed on the transfer shelf 123 to the boat 217 placed at a lower position.

After a predetermined number of wafers 200 are transferred to the boat 217, the boat 217 is loaded into the process furnace 202 by the boat elevator 121, and the process furnace 202 is hermetically closed by the seal cap 219. In the hermetically closed process furnace 202, a process such as heat treatment is performed on the wafers 200 by heating the wafers 200 and supplying process gas to the inside of the process furnace 202.

After the wafers 200 are processed, in the reverse order, the wafers 200 are transferred from the boat 217 to the cassette 100 of the transfer shelf 123 by the wafer transfer device 112, and then the cassette 100 is transferred by the cassette carrier 115 from the transfer shelf 123 to the cassette stage 105 where the cassette 100 is carried to the outside of the case 101 by the external carrying device (not shown).

When the boat 217 is placed at a lower position, the bottom side of the process furnace 202 is hermetically closed by the furnace port shutter 116 to prevent an inflow of outside air into the process furnace 202.

In addition, the present invention is not limited to the above-described embodiments. That is, many different embodiments are possible within the scope and spirit of the present invention.

For example, the film-forming process is not limited to a process of forming a titanium nitride film. The film-forming process can be applied to processes of forming other thin films such as a silicon nitride film, a silicon oxide film, other nitride or oxide films, a metal film, and a semiconductor film (for example, a poly silicon film).

In the above-described embodiments, a bath type vertical film forming apparatus operating according to an ALD method is described; however, the present invention can be applied to other apparatuses such as a single wafer type apparatus.

In the above-described embodiments, wafer processing is explained; however, other objects such as a photomask, a printed circuit board, a liquid crystal panel, a compact disk, and a magnetic disk can be processed.

According to the present invention, molecules of a surplus source attached to parts such as the surface of a wafer can be removed in a short time, and thus, productivity can be improved. In addition, since sufficient purge is possible within a short time, a thinner film can be formed.

While aspects and embodiments of the present invention have been described, the present invention also includes the following embodiments.

(Supplementary Note 1)

According to an embodiment of the present invention, there is provided a semiconductor device manufacturing method comprising:

a first process of forming a film containing a first element on a substrate by supplying a source gas containing the first element to a substrate processing chamber in which the substrate is accommodated; and a second process of removing the source gas remaining in the substrate processing chamber by momentarily supplying an inert gas to the substrate processing chamber.

According to the semiconductor device manufacturing method, surplus source molecules adsorbed on the surface of the substrate or the like can be removed within a short time.

(Supplementary Note 2)

The semiconductor device manufacturing method of Supplementary Note 1 may further comprise:

a third process of supplying a modification gas containing a second element to the substrate processing chamber so that the film containing the first element and formed on the substrate in the first process is modified into a film containing the first and second elements; and a fourth process of removing the modification gas remaining in the substrate processing chamber by momentarily supplying the inert gas to the substrate processing chamber.

According to the semiconductor device manufacturing method, surplus source molecules adsorbed on the surface of the substrate or the like in the first process and the third process can be removed within a short time.

(Supplementary Note 3)

In the semiconductor device manufacturing method of Supplementary Note 2, the source gas may be liquid at ordinary temperature and pressure;

in the first process, the source gas may be supplied to the substrate processing chamber while exhausting an inside atmosphere of the substrate processing chamber; and in the third process, the modification gas may be supplied to the substrate processing chamber while exhausting the inside atmosphere of the substrate processing chamber.

According to the semiconductor device manufacturing method, in the first process or the third process, adsorption of the source gas or the modification gas to a part such as the surface of the substrate can be suppressed, and thus, in the second process or the fourth process, surplus source molecules adsorbed on the surface of the substrate or the like can be removed within a short time.

(Supplementary Note 4)

In the semiconductor device manufacturing method of Supplementary Note 2 or 3, the inside pressure of the substrate processing chamber may be increased by about 10 Pa to about 200 Pa after the inert gas is supplied to the substrate processing chamber in the second process and the fourth process.

According to the semiconductor device manufacturing method, surplus source molecules adsorbed on the surface of the substrate or the like can be effectively removed within a short time.

(Supplementary Note 5)

The semiconductor device manufacturing method of any one of Supplementary Notes 2 to 4 may further comprise a filling process of filling an inert gas in a gas tank connected to the substrate processing chamber, wherein the filling process may be performed before each of the second process and the fourth process, and in each of the second process and the fourth process, the inert gas filled in the gas tank in the filling process may be supplied to the substrate processing chamber.

According to the semiconductor device manufacturing method, surplus source molecules adsorbed on the surface of the substrate or the like can be easily removed within a short time.

(Supplementary Note 6)

In the semiconductor device manufacturing method of Supplementary Note 5, the filling process may be performed in parallel with the first process or the third process so that the filling process is overlapped in time with the first process or the third process.

According to the semiconductor device manufacturing method, surplus source molecules adsorbed on the surface of the substrate or the like can be removed within a short time without a decrease of productivity.

(Supplementary Note 7)

In the semiconductor device manufacturing method of Supplementary Note 5 or 6, the inert gas may be filled in the gas tank in the filling process until the gas tank reaches a predetermined pressure.

According to the semiconductor device manufacturing method, although the volume of the gas tank is constant, various substrate processing chambers having different volumes can be supported by using the gas tank. In addition, by using the gas tank having a fixed volume, various film-forming processes can be handled although the film-forming processes require different optimal pressure increase values in the substrate processing chamber after the inert gas is supplied to the substrate processing chamber.

(Supplementary Note 8)

The semiconductor device manufacturing method of any one of Supplementary Notes 2 to 7 may further comprise an exhausting process of exhausting an inside atmosphere of the substrate processing chamber, wherein the first process, the second process, the exhausting process, the third process, the fourth process, and the exhausting process may be performed in the listed order.

According to the semiconductor device manufacturing method, source molecules released from the surface of the substrate can be surely removed.

(Supplementary Note 9)

The semiconductor device manufacturing method of any one of Supplementary Notes 2 to 4 may further comprise a process of filling an inert gas in an inert gas supply pipe connected to the substrate processing chamber, wherein the process of filling the inert gas in the inert gas supply pipe may be performed before each of the second process and the fourth process, and in each of the second process and the fourth process, the inert gas filled in the inert gas supply pipe in the process of filling the inert gas in the inert gas supply pipe may be supplied to the substrate processing chamber.

According to the semiconductor device manufacturing method, surplus source molecules adsorbed on the surface of the substrate or the like can be easily removed within a short time.

(Supplementary Note 10)

According to another embodiment of the present invention, there is provided a substrate processing apparatus comprising:

a substrate processing chamber configured to accommodate a substrate;

a source gas supply unit configured to supply a source gas to the substrate processing chamber;

an inert gas supply unit configured to supply an inert gas to the substrate processing chamber;

an exhaust unit configured to exhaust an inside atmosphere of the substrate processing chamber; and a control unit configured to control the source gas supply unit, the inert gas supply unit, and the exhaust unit, wherein the control unit controls supply of the inert gas in a manner such that that the inert gas is supplied to the substrate processing chamber after the source gas is supplied to the substrate processing chamber, and the control unit controls the supply of the inert gas to the substrate processing chamber in a manner such that the inert gas is momentarily supplied to substrate processing chamber.

According to the substrate processing apparatus, surplus source molecules adsorbed on the surface of the substrate or the like can be removed within a short time.

(Supplementary Note 11)

The substrate processing apparatus of Supplementary Note 10 may further comprise a modification gas supply unit configured to supply a modification gas to the substrate processing chamber, wherein the control unit may control supply of the inert gas, in a manner such that that the inert gas is supplied to the substrate processing chamber after the source gas is supplied to the substrate processing chamber, and then the inert gas is supplied to the substrate processing chamber after the modification gas is supplied to the substrate processing chamber, wherein the control unit may control the supply of the inert gas to the substrate processing chamber in a manner such that such that the inert gas is momentarily supplied to the substrate processing chamber.

According to the substrate processing apparatus, in a source gas supply process or a modification gas supply process, surplus source molecules adsorbed on the surface of the substrate or the like can be removed within a short time.

(Supplementary Note 12)

In the substrate processing apparatus of Supplementary Note 10 or 11, the inert gas supply unit may comprise:

an inert gas supply pipe connected to the substrate processing chamber;

a first inert gas on-off valve configured to open and close the inert gas supply pipe; and a gas tank installed at an upstream side of the first inert gas on-off valve, wherein the control unit may control the supply of the inert gas to the substrate processing chamber, in a manner such that such that the inert gas is supplied to the inert gas supply pipe in a state where the first inert gas on-off valve is closed to store the inert gas in the gas tank, and then the first inert gas on-off valve is opened to supply the inert gas stored in the gas tank to the substrate processing chamber.

According to the substrate processing apparatus, surplus source molecules adsorbed on the surface of the substrate or the like can be removed within a short time.

(Supplementary Note 13)

In the substrate processing apparatus of Supplementary Note 12, the inert gas supply unit may further comprise a second inert gas on-off valve installed at an upstream side of the gas tank, wherein the control unit may control the supply of the inert gas to the substrate processing chamber, in manner such that the inert gas is supplied to the inert gas supply pipe in a state where the first inert gas on-off valve is closed and the second inert gas on-off valve is opened so as to store the inert gas in the gas tank, and then the inert gas stored in the gas tank is supplied to the substrate processing chamber in a state where the first inert gas on-off valve is opened and the second inert gas on-off valve is closed.

According to the substrate processing apparatus, a pressure increase in the substrate processing chamber can be easily controlled.

(Supplementary Note 14)

In the substrate processing apparatus of Supplementary Note 12 or 13, the gas tank may have an inner diameter greater than that of the inert gas supply pipe.

According to the substrate processing apparatus, the inert gas stored in the gas tank can be supplied to the substrate processing chamber in a short time.

(Supplementary Note 15)

In the substrate processing apparatus of any one of Supplementary Notes 12 to 14, the ratio of the volume of the substrate processing chamber/the volume of the gas tank may be about 200 to about 2000.

According to the substrate processing apparatus, surplus source molecules adsorbed on the surface of the substrate or the like can be effectively removed within a short time.

(Supplementary Note 16)

In the substrate processing apparatus of Supplementary Note 10 or 11, the inert gas supply unit may comprise:

an inert gas supply pipe connected to the substrate processing chamber; and a first inert gas on-off valve configured to open and close the inert gas supply pipe, wherein the control unit may control the supply of the inert gas to the substrate processing chamber, in a manner such that such that the inert gas is filled in the inert gas supply pipe in a state where the first inert gas on-off valve is closed, and then the first inert gas on-off valve is opened to supply the inert gas filled in the gas tank to the substrate processing chamber.

According to the substrate processing apparatus, surplus source molecules adsorbed on the surface of the substrate or the like can be removed within a short time.

What is claimed is:

1. A semiconductor device manufacturing method comprising:

a first process of forming a film containing a predetermined element on a substrate by supplying a source gas containing the predetermined element to a substrate processing chamber in which the substrate is accommodated;

a second process of removing the source gas remaining in the substrate processing chamber by supplying an inert gas to the substrate processing chamber;

a third process of modifying the predetermined element-containing film formed in the first process by supplying a modification gas that reacts with the predetermined element to the substrate processing chamber;

a fourth process of removing the modification gas remaining in the substrate processing chamber by supplying an inert gas to the substrate processing chamber; and a filling process of filling an inert gas in a gas tank connected to the substrate processing chamber, wherein the filling process is performed before each of the second process and the fourth process, and in each of the second process and the fourth process, the inert gas filled in the gas tank in the filling process is supplied to the substrate processing chamber.

2. The semiconductor device manufacturing method of claim 1, wherein the predetermined element is a first element, and the third process comprises supplying a modification gas containing a second element to the substrate processing chamber so that the film containing the first element and formed on the substrate in the first process is modified into a film containing the first and second elements; and the fourth process comprises removing the modification gas remaining in the substrate processing chamber by momentarily supplying the inert gas to the substrate processing chamber.

3. The semiconductor device manufacturing method of claim 1, wherein the source gas is liquid at ordinary temperature and pressure;

in the first process, the source gas is supplied to the substrate processing chamber while exhausting an inside atmosphere of the substrate processing chamber; and in the third process, the modification gas is supplied to the substrate processing chamber while exhausting the inside atmosphere of the substrate processing chamber.

4. The semiconductor device manufacturing method of claim 1, wherein in the filling process, the inert gas is filled in the gas tank until the gas tank reaches a predetermined pressure.

5. The semiconductor device manufacturing method of claim 1, further comprising an exhausting process of exhausting an inside atmosphere of the substrate processing chamber, wherein the first process, the second process, the exhausting process, the third process, the fourth process, and the exhausting process are performed in the listed order.

6. The semiconductor device manufacturing method of claim 1, further comprising a process of filling an inert gas in an inert gas supply pipe connected to the substrate processing chamber,
wherein the process of filling the inert gas in the inert gas supply pipe is performed before each of the second process and the fourth process, and
in each of the second process and the fourth process, the inert gas filled in the inert gas supply pipe in the process of filling the inert gas in the inert gas supply pipe is supplied to the substrate processing chamber.

7. A semiconductor device manufacturing method comprising:
a first process of forming a film containing a predetermined element on a substrate by supplying a source gas containing the predetermined element to a substrate processing chamber in which the substrate is accommodated;
a second process of removing the source gas remaining in the substrate processing chamber by supplying an inert gas to the substrate processing chamber;
a third process of modifying the predetermined element-containing film formed in the first process by supplying a modification gas that reacts with the predetermined element to the substrate processing chamber;
a fourth process of removing the modification gas remaining in the substrate processing chamber by supplying an inert gas to the substrate processing chamber; and
a filling process of filling an inert gas in an inert gas supply pipe connected to the substrate processing chamber,
wherein the filling process is performed before each of the second process and the fourth process, and
in each of the second process and the fourth process, the inert gas filled in the inert gas supply pipe in the filling process is supplied to the substrate processing chamber.

* * * * *